(12) United States Patent  
Baker

(10) Patent No.: US 7,133,307 B2
(45) Date of Patent: *Nov. 7, 2006

(54) RESISTIVE MEMORY ELEMENT SENSING USING AVERAGING

(75) Inventor: R. Jacob Baker, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/674,550

(22) Filed: Oct. 1, 2003

(65) Prior Publication Data

US 2004/0062100 A1    Apr. 1, 2004

Related U.S. Application Data

(60) Continuation of application No. 10/290,297, filed on Nov. 8, 2002, now Pat. No. 6,822,892, which is a division of application No. 09/938,617, filed on Aug. 27, 2001, now Pat. No. 6,504,750.

(51) Int. Cl.
    *G11C 11/21* (2006.01)
(52) U.S. Cl. .............. 365/148; 365/158; 365/189.07; 365/189.09; 365/225.5; 365/236
(58) Field of Classification Search ............. 365/158, 365/148, 190, 204, 205, 236, 189.07, 189.09, 365/225.5, 243.5, 233
    See application file for complete search history.

(56) References Cited

U.S. PATENT DOCUMENTS

| 3,818,501 | A |   | 6/1974  | Fiorino .................... 360/40 |
| 3,979,740 | A | * | 9/1976  | Forbat et al. ............... 340/512 |
| 4,197,515 | A |   | 4/1980  | Hornfeldt et al. ........... 333/165 |
| 4,281,291 | A |   | 7/1981  | Lamare et al. .............. 341/150 |
| 4,369,501 | A |   | 1/1983  | Brown et al. .................. 365/8 |
| 4,450,387 | A | * | 5/1984  | Reed et al. ................. 315/375 |
| 4,536,851 | A |   | 8/1985  | Germanton et al. ........ 702/131 |
| 4,559,453 | A | * | 12/1985 | Muggli et al. .............. 250/565 |
| 4,718,036 | A |   | 1/1988  | Halbert et al. .............. 708/823 |
| 5,243,544 | A |   | 9/1993  | Schoess ...................... 702/141 |
| 5,281,860 | A |   | 1/1994  | Krenik et al. ............... 327/407 |
| 5,329,480 | A |   | 7/1994  | Wu et al. .................... 365/170 |
| 5,754,470 | A |   | 5/1998  | Engh et al. ............. 365/185.03 |
| 5,801,652 | A |   | 9/1998  | Gong ......................... 341/131 |
| 5,907,299 | A |   | 5/1999  | Green et al. ................ 341/143 |
| 5,959,441 | A |   | 9/1999  | Brown ....................... 323/282 |
| 5,986,598 | A |   | 11/1999 | Mittel ........................ 341/143 |
| 5,999,454 | A |   | 12/1999 | Smith ..................... 365/185.21 |
| 6,038,166 | A |   | 3/2000  | Wong .................... 365/185.03 |
| 6,128,239 | A |   | 10/2000 | Perner ........................ 365/209 |
| 6,188,615 | B1|   | 2/2001  | Perner et al. .......... 365/189.01 |

(Continued)

*Primary Examiner*—Andrew Q. Tran
(74) *Attorney, Agent, or Firm*—Dickstein ShapiroLLP

(57) ABSTRACT

A system for determining the logic state of a resistive memory cell element, for example an MRAM resistive cell element. The system includes a controlled voltage supply, an electronic charge reservoir, a current source, and a pulse counter. The controlled voltage supply is connected to the resistive memory cell element to maintain a constant voltage across the resistive element. The charge reservoir is connected to the voltage supply to provide a current through the resistive element. The current source is connected to the charge reservoir to repeatedly supply a pulse of current to recharge the reservoir upon depletion of electronic charge from the reservoir, and the pulse counter provides a count of the number of pulses supplied by the current source over a predetermined time. The count represents a logic state of the memory cell element.

9 Claims, 6 Drawing Sheets

U.S. PATENT DOCUMENTS

| | | | |
|---|---|---|---|
| 6,243,034 B1 | 6/2001 | Regier | 341/166 |
| 6,317,375 B1 | 11/2001 | Perner | 365/206 |
| 6,317,376 B1 | 11/2001 | Tran et al. | 365/210 |
| 6,385,111 B1 | 5/2002 | Tran et al. | 365/210 |
| 6,396,329 B1 | 5/2002 | Zerbe | 327/336 |
| 6,504,750 B1 | 1/2003 | Baker | 365/148 |
| 6,697,444 B1 | 2/2004 | Iizuka et al. | 375/343 |
| 6,788,563 B1 | 9/2004 | Thompson et al. | 365/145 |
| 2002/0117895 A1 | 8/2002 | Kemp et al. | 307/10.1 |
| 2002/0126524 A1 | 9/2002 | Sugibayashi et al. | 365/158 |
| 2003/0151532 A1 | 8/2003 | Chen et al. | 341/120 |
| 2003/0198075 A1 | 10/2003 | Brown | 365/145 |

* cited by examiner

RESISTIVE MEMORY ELEMENT SENSING USING AVERAGING

CROSS REFERENCE TO RELATED APPLICATIONS

The present application is a continuation application of U.S. patent application Ser. No. 10/290,297, filed on Nov. 8, 2002 now U.S. Pat. No. 6,822,892, which in turn is a divisional application of U.S. patent application Ser. No. 09/938,617, filed on Aug. 27, 2001 (now U.S. Pat. No. 6,504,750, issued on Jan. 7, 2003), disclosures of which are herewith incorporated by reference in their entirety.

BACKGROUND OF THE INVENTION

1. Field of the Invention

The present invention relates to the field of resistor-based memory circuits. More particularly, it relates to a method for precisely sensing the resistance value of a resistor-based memory cell, for example, an MRAM magnetic memory cell.

2. Description of the Related Art

FIG. 1 shows one example of a resistor based memory. The memory includes a memory cell array 90 having a plurality of row lines 100 arranged in normal orientation to a plurality of column lines 110. Each row line is connected to each of the column lines by a respective of resistor 120.

A magnetic random access memory (MRAM) is one approach to implementing a resistor based memory. In an MRAM, each resistive memory cell includes a magnetizable film. The resistance of the cell varies, depending on the magnetization state of the film. Logical data can be stored by magnetizing the film of particular cells so as to represent the logic states of the data. The stored data can be read by measuring the resistance of the cells, and interpreting the resistance values measured as logic states. Making the required resistance measurements, however, is problematic.

In a resistance memory, one resistance value, e.g., a higher value, may be used to signify a logic "HIGH" while another resistance value, e.g., a lower value, may be used to signify a logic "LOW." The stored logic state can be detected by measuring the memory cell resistance using Ohm's law. For example, resistance is determined by holding voltage constant across a resistor and measuring, directly or indirectly, the current that flows through the resistor. Note that, for MRAM sensing purposes, the absolute magnitude of resistance need not be known; only whether the resistance is above or below a value that is intermediate to the logic high and logic low values.

Sensing the logic state of an MRAM memory element is difficult because the technology of the MRAM device imposes multiple constraints. In a typical MRAM device an element in a high resistance state has a resistance of about 1 MΩ. An element in a low resistance state has a resistance of about 950 KΩ. The differential resistance between a logic one and a logic zero is thus about 50 KΩ, or 5% of scale.

Accordingly, there is a need for a simplified resistance measuring circuit able to repeatably and rapidly distinguish resistance values varying by less than 5% on a one MΩ scale.

BRIEF SUMMARY OF THE INVENTION

The invention provides a method and apparatus for measuring the resistance of a resistive memory element. The resistance is measured by charging a capacitor, allowing the capacitor to discharge through a selected resistive memory element while maintaining a substantially constant voltage across the resistive memory element, sensing the charge remaining on the capacitor, repeatedly recharging the capacitor with a pulse of definite charge each time the capacitor voltage drops to a predetermined value, and determining a time average current into the capacitor based on a duty cycle of the recharging pulses. Knowledge of the time average current into the capacitor, yields the current flowing into the resistor since the current flowing into the capacitor must equal the current flowing out of the capacitor and into the resistor. One can measure or set the voltage across the resistive memory element and determine the resistance of the element from the current through the element and the voltage across it.

In various aspects of the invention, the actual resistance of the memory element is not calculated. Instead, the number of capacitor charging pulses is counted, and the numerical count thus acquired is compared to a reference count value. The reference value is chosen to lie between count values representing logical one and logical zero. Therefore a count value greater than the reference indicates one logical state, and a count value less than the reference value indicates another. In a further aspect of the invention, more than one reference value is established, and a memory element capable of exhibiting more than two resistance values is used. Consequently the memory element may store more than two logical values. The logical values are determined based on the relationship between the count value counted and the standard values used to establish thresholds between logical values.

In a further aspect, the apparatus and method of the invention may be used to measure the resistance or impedance of any resistive or impedance device.

These and other aspects and features of the invention will be more clearly understood from the following detailed description which is provided in conjunction with the accompanying drawings.

DETAILED DESCRIPTION OF THE INVENTION

Figure 1:
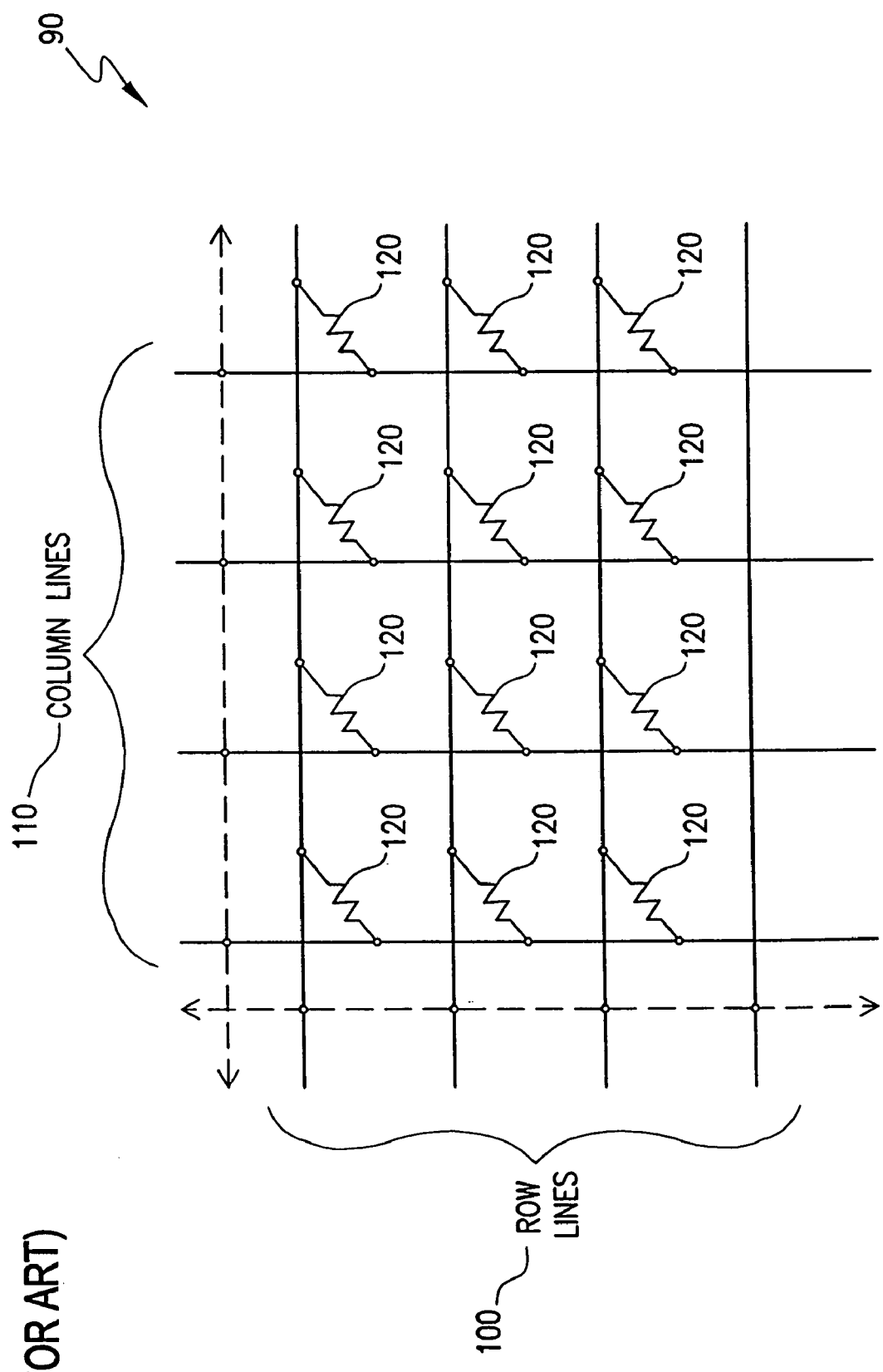
FIG. 1 shows a conventional magnetic random access memory array in schematic form.
Figure 2:
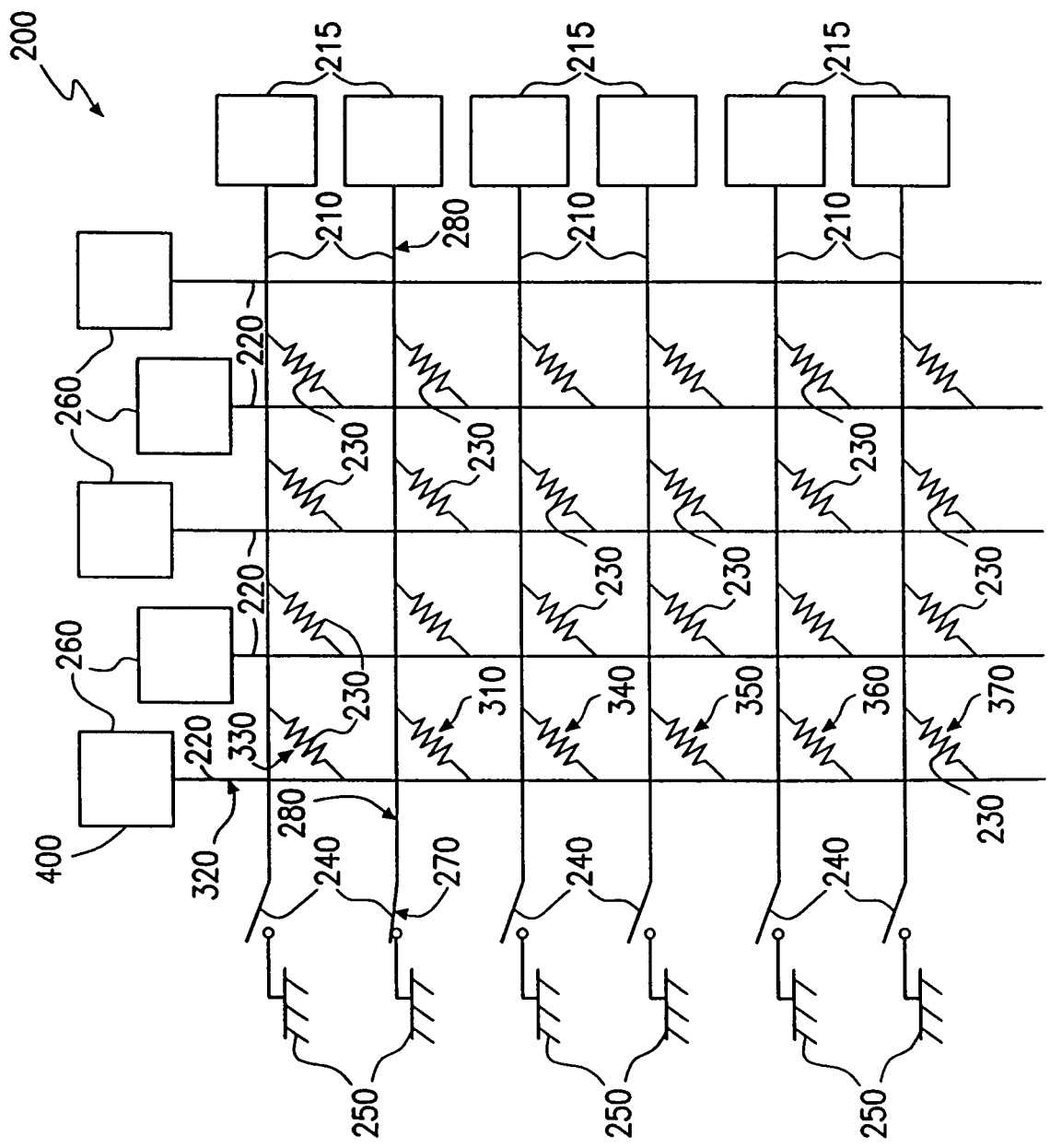
FIG. 2 shows a magnetic random access memory device according to one aspect of the present invention in schematic form, including resistance sensing circuits.

FIG. 2 shows a portion of a resistive memory device according to the invention. The device includes an array 200 of Magnetic Random Access Memory (MRAM) elements, a plurality of electrically conductive row lines 210, and a plurality of electrically conductive column lines 220. Each row line is connected to each of the plurality of column lines by a respective MRAM resistive element 230. A plurality of switches 240, typically implemented as transistors, are each switchingly connected between one of the row lines and a first source of constant potential (ground) 250. A plurality of sensing circuits 260, are respectively connected to the plurality of column lines 220. Each sensing circuit 260 includes a source of constant electrical potential ($V_A$) which is applied to the respective column line. A plurality of pull-up voltage sources 215, supplying voltage $V_A$, are respectively connected to each of the plurality of row lines 210.

In operation, an exemplary switch 240, such as switch 270 associated with a particular row line 280, is closed so as to bring that row line to ground potential and a particular column line, e.g., 320 is sensed to read the resistance value of a particular resistor 310.

Figure 3:
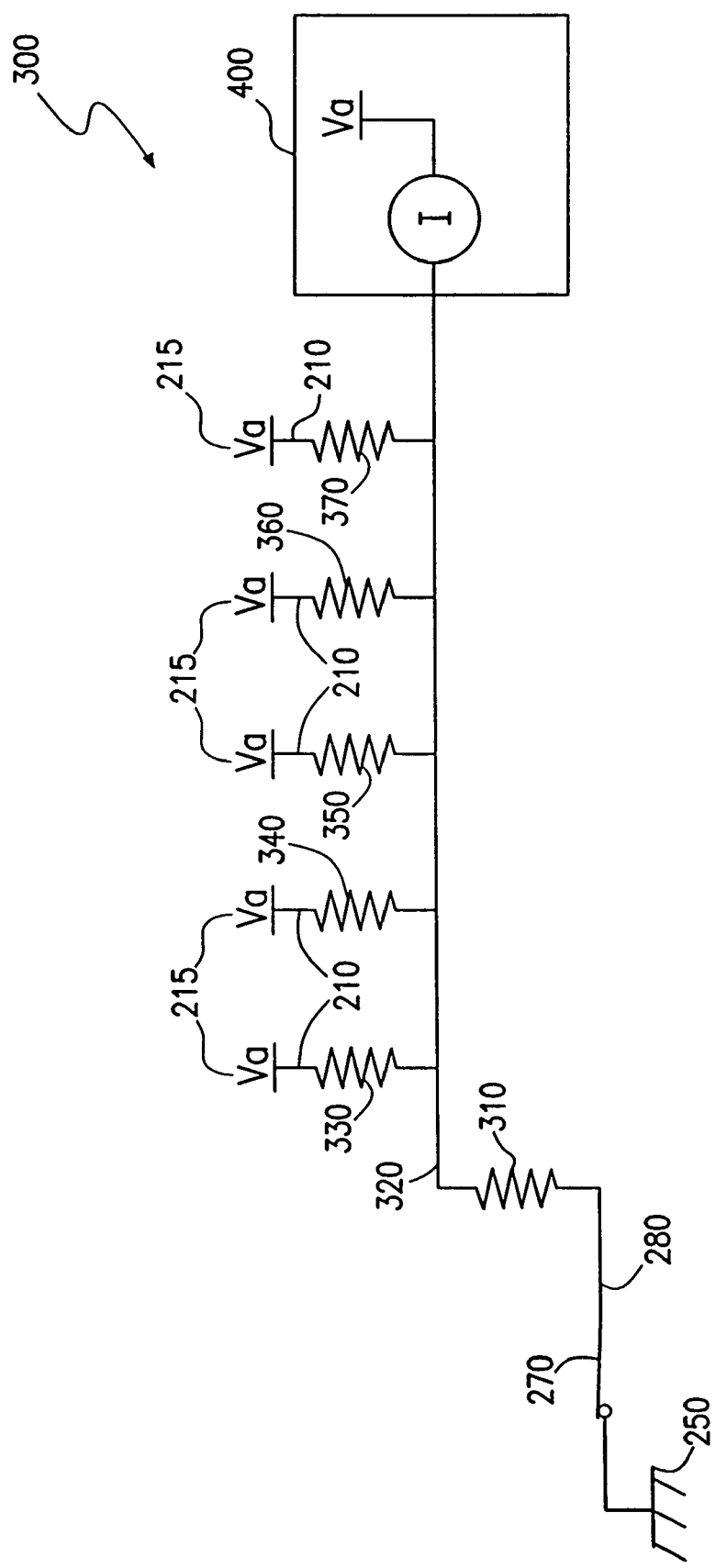
FIG. 3 shows a portion of a magnetic random access memory device according to one aspect of the invention including a sensing circuit and sneak resistance.

FIG. 3 shows the resulting electrical circuit for the relevant portion 300 of the memory array when row 280 is grounded. As shown, memory element 310 to be sensed is connected between a grounded row line 280 and a particular column line 320. Also connected to the column line 320 is a plurality of other resistive memory elements (e.g. elements 330, 340, 350, 360, 370) each of which is connected at its opposite end to a pull-up voltage source $V_A$ 215 through a respective row line 210. In addition, a respective sensing circuit 400 is connected to the column line 320. The sensing circuit 400 includes a voltage supply that maintains the column line 320 at electrical potential $V_A$.

The other resistive memory elements (those tied to ungrounded row lines) 330, 340, 350, 360, 370, form an equivalent resistance referred to as sneak resistance. The effective resistance of the sneak resistance is small. A typical value for sneak resistance might be 1 KΩ. Nevertheless, because both ends of each ungrounded resistor are ideally maintained at the same potential (here $V_A$) as the column line 320, net current flow through the sneak resistance is desirably nearly zero.

In contrast, a measurable current flows through the grounded resistor memory element 310. This measurable current allows evaluation of the resistance of the memory element 310 by the sensing circuit 400.

One proposal for sensing the resistance value of a memory cell is to charge a capacitor to a predetermined first voltage and then discharge the capacitor through the memory cell resistance until it holds a second lower predetermined voltage. The time taken for the capacitor to discharge from the first to the second voltage is a measure of cell resistance. A problem with this approach is that since the resistance values representing the different logic states of a cell are very close in value (only 5% difference) it is difficult to obtain an accurate and reliable resistance measurement, even if digital counting techniques are employed to measure the discharge time of the capacitor.

Thus, even when using digital counting techniques, the discharge time of the capacitor must be counted quite precisely to sense the different resistance values and distinguish logic states. To achieve this precision, either the counting clock must be operated at a high frequency or the capacitor must be discharged relatively slowly. Neither of these options is desirable, since slow capacitor discharge means slow reading of stored memory values, and a high clock frequency requires high frequency components. In either case, a counter having a large number of stages is also required.

The present invention provides a resistive measuring circuit and operating method which rapidly ascertains a resistive value without storing large data counts, and without requiring highly precisioned components.

Figure 4:
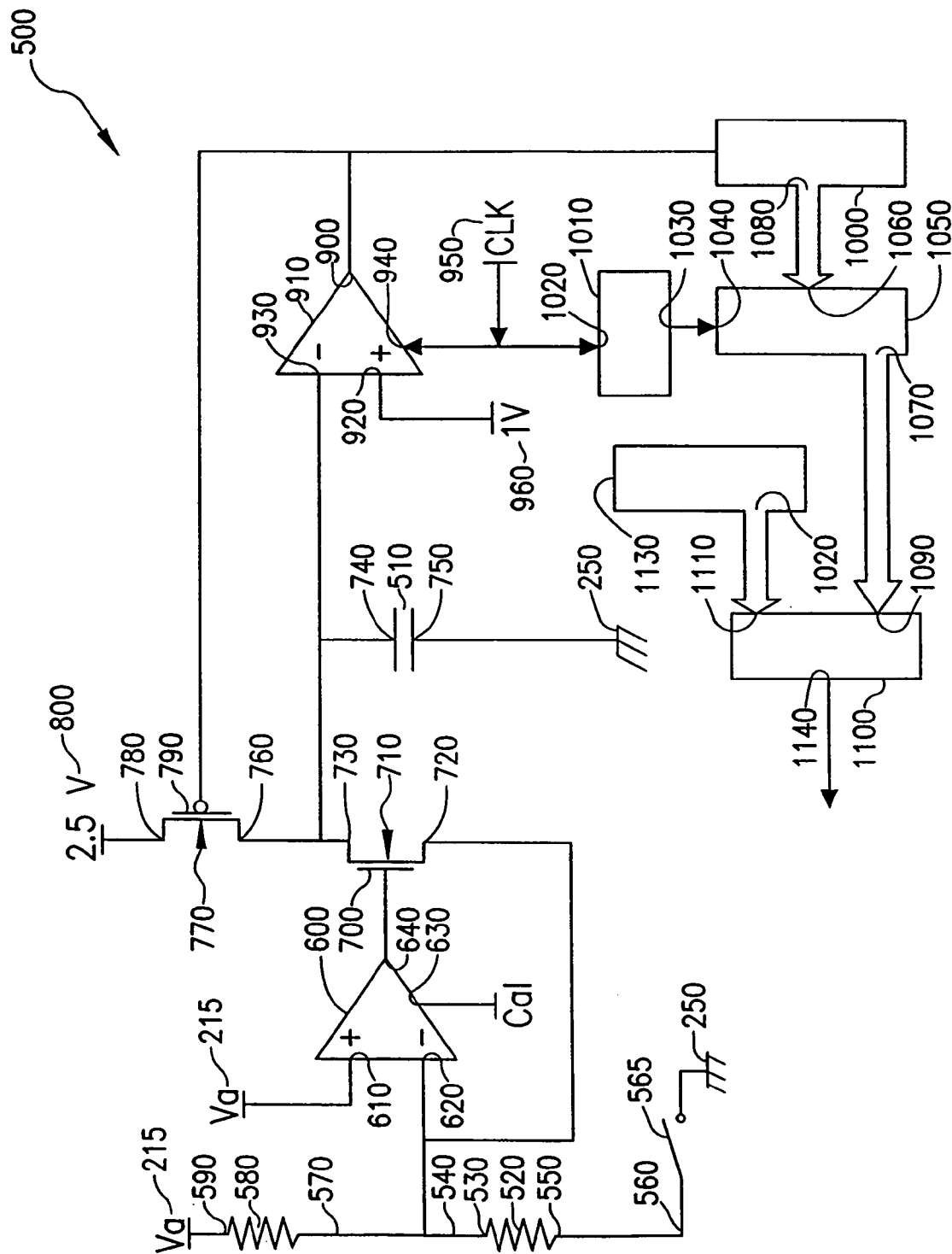
FIG. 4 shows a circuit for sensing resistance using averaging according to one aspect of the present invention.

FIG. 4 illustrates an exemplary embodiment of a resistance sensing circuit 500 constructed in accordance with the invention. Sensing circuit 500 relies on the cyclical discharge of a capacitor 510 to determine the value of a memory cell resistance 520. The duty cycle of a recharging signal for the capacitor 510 represents a value of resistance 520.

The resistance measuring circuit 500 outputs a bit stream from an output 900 of a comparator 910. The ratio of logic one bits to a total number of bits (or, in another aspect of the invention, the ratio of logic one bits to logic zero bits) in the bit stream yields a numerical value. This numerical value corresponds to the current that flows through the resistance 520 in response to a known applied voltage. For example, assume that a current source can deliver current at two discrete current levels, corresponding to two different states of a logical input signal. When the signal is in logic one state, the source delivers, for example, 2 μA. When the signal is in a logic zero state, the source delivers, for example, 0 μA. The logical input signal is monitored over a finite time span corresponding to a number of bit-length time periods. Over that time span, the numbers of logic one and logic zero bits are recorded. By straightforward algebra, the average current delivered by the current source over the corresponding time span may be calculated as follows:

$$IAVG = \frac{(\text{number of logic 1 bits})*2\ \mu A + (\text{number of logic 0 bits})*0\ \mu A}{\text{total number of bits in the signal}}$$

As an example, if, over a time span corresponding to 4 cycles, there is one logic one bit and three logic zero bits then the average current over the four cycles is 0.5 μA.

$$IAVG = \frac{1*2\ \mu A + 3*0\ \mu A}{4} = 0.5\ \mu A$$

The operation of the FIG. 4 sensing circuit is now described in greater detail. An MRAM resistive memory element 520 to be sensed has a first end 530 connected to a column line 540 and a second end 550 connected to ground 250 through a row line 560 and switch 565. Also connected to the column line 540 is a first end 570 of a sneak resistance 580. The sneak resistance has a second end 590 connected to a source of constant potential $V_A$ 215. The sneak resistance 580 represents a plurality of MRAM resistive elements associated with the particular column line 540 and with a respective plurality of unselected row lines, as described above with reference to FIG. 3.

A first operational amplifier (op-amp) integrator 600 is provided which has a non-inverting (positive) input 610, an inverting (negative) input 620, a calibrate offset input 630, and an output 640. The output 640 of the first op-amp 600 is connected to a control input (gate) 700 of a first transistor 710, which in this exemplary embodiment is an N-channel transistor.

The first transistor 710 includes a drain 720 connected to both the selected column line 540 and the inverting input 620 of the first op-amp 600. The first transistor also includes a source 730 operatively connected to a first terminal 740 of a capacitor 510. The capacitor 510 includes a second terminal 750 operatively connected to a ground potential 250. The source 730 of the first transistor 710 is also connected to a drain 760 of a second transistor 770. In this exemplary embodiment, this second transistor 770 is a PMOS transistor. The second transistor 770 includes a source 780 and a gate 790, in addition to the drain 760. The source 780 is operatively connected to a supply voltage 800, which in this exemplary embodiment is 2.5 volts. The gate 790 is operatively connected to an output 900 of a clocked comparator 910. The clocked comparator 910, shown as a clocked second operational amplifier, includes the output 900, a non-inverting (positive) input 920, an inverting (negative) input 930, and a clock input 940 connected to a source of a clock signal 950. The comparator 910 may be implemented as a simple clocked latch, or the comparator 910 may be simply enabled by the clock CLK signal.

The output 900 of the second op-amp is also connected to a counter 1000 which counts the rising transitions at the comparator output 900. The non-inverting input 920 of the second op-amp 910 is connected to a source of a reference voltage 960 (1 volt in the exemplary embodiment shown).

A second counter 1010 counts the total number of transitions of the clock 950 during a measuring cycle. This counter 1010 includes an input 1020 for receiving clock signal 950 and at output 1030 that exhibits a signal when counter 1010 reaches a predetermined count. The output 1030 is connected to a latch input 1040 of a latching buffer 1050. The latching buffer 1050 includes a data input 1060 and data output 1070. The data input 1060 is connected to a data output 1080 of the first counter 1000. The data output 1070 is connected to a first data input 1090 of a digital comparator 1100. The digital comparator 1100 includes a second data input 1110 connected to a data output 1120 of a source of a reference value 1130. In one embodiment, the source of the reference value 1130 is a buffer or other device holding a digital number.

The sensing circuit 500 operates in the following manner when activated when a row line is grounded and a resistance value is to be sensed. Capacitor 510 is initially discharged, resulting in a negative output signal on the output 900 of the second op-amp 910. This causes the second transistor 770 to be placed in a conductive state, permitting capacitor 510 to begin charging. When the voltage on capacitor 510 equals that applied to the non-inverting input 920 of the second op-amp 910 (here 1 volt), the output 900 of the second op-amp changes state to a positive value at the next transition of the clock 950. This turns off the second transistor 770. The charge stored on capacitor 510 is discharged through the first transistor 710 and cell resistance 520 under the control of the first op-amp 600. The first op-amp 600 tries to maintain a constant voltage VA on the selected column line 540.

As charge is depleted from capacitor 510 the voltage on the capacitor drops until it falls below the voltage (1 volt) applied to the reference input 920 of the clocked comparator 910. After this threshold is passed, the next positive clock transition applied to the clock input 940 causes the output of comparator 910 to go low again turning on the second transistor 770 and causing current to begin flowing through the second transistor 770 to recharge capacitor 510.

In one embodiment, the capacitor 510 is recharged during one clock cycle of clock source 950, so the comparator output 900 switches to high and the second transistor 770 is shut off again at the next positive clock transition. Transistor 770 is sized to allow a substantially constant current (e.g., 2.5 µA) to flow to capacitor 510 when transistor 770 is in a conductive state.

The described charging and discharging of capacitor 510 under the control of the first 710 and second 770 transistors occurs repeatedly during one sense cycle. Each time the output of the comparator 910 goes low, a current pulse is allowed to pass through the second transistor 770 and the first counter 1000 incremented. Each time the clock signal 950 transitions positive, the second counter 1010 is incremented. When the second counter 1010 reaches a preset value, it triggers the latch 1050, which latches that number of pulses counted by the first counter 1000 during the sensing period. The number of pulses counted is latched onto the data output 1070 (and data input 1090). The comparator 1100 then evaluates the values presented at the first and second data inputs 1090, 1110, and ascertains whether the value at the first data input 1090 is larger or smaller than the reference value at the second data input 1110. The reference value at input 1110 is set between two count values which correspond to "hi" and "low" resistance states for resistor 520. Thus if the value of the first data input 1090 is larger than the reference value, then a first logical value (e.g. logic one) is output on an output 1140 of the digital comparator 1100. If the value of the first data input 1090 is smaller than the reference value, then a second logical value (e.g. logic zero) is output on the output 1140 of the digital comparator 1100. In a variation, a comparator 1100 capable of comparing the digital value applied at the data input 1090 to a plurality of reference values 1110 can distinguish a value stored in a single resistive memory element as between multiple resistance values. In a further variation, the capacitor 510 is pre-charged prior to a measuring cycle. By pre-charging the capacitor 510, the number of cycles of the clock signal 950 required to measure the state of the memory element is reduced. In another variation the capacitor is not pre-charged, in which case sensing the resistance of the memory element takes longer, but the circuitry and/or process is simplified.

Figure 5:
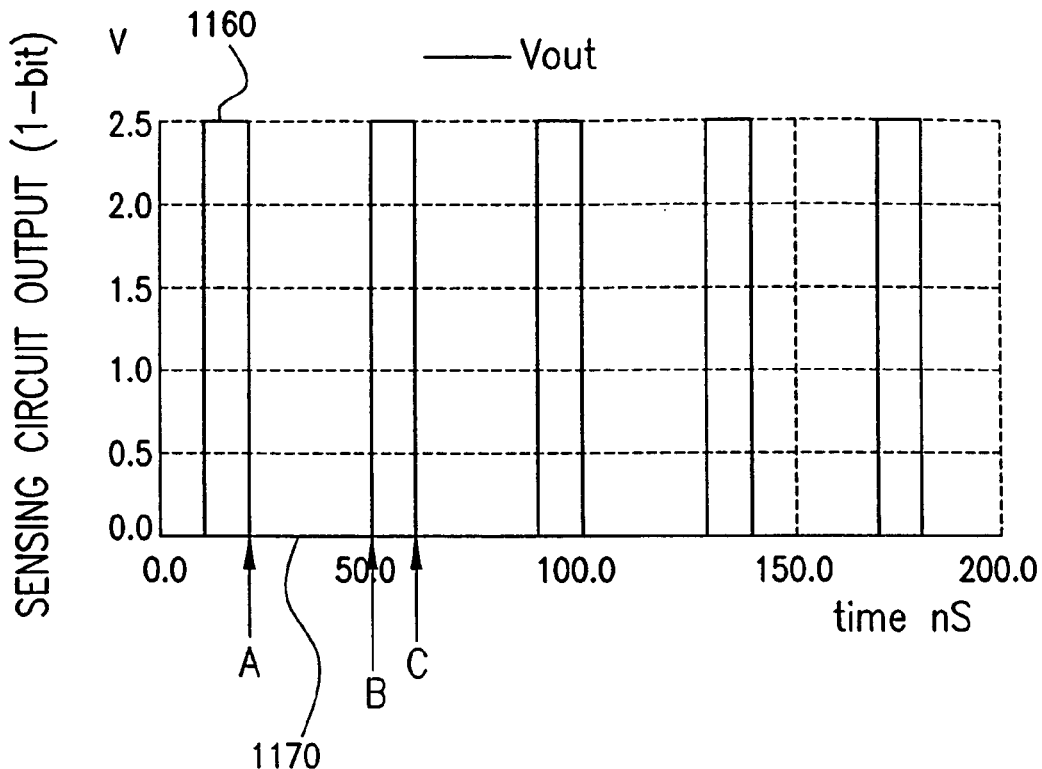
FIG. 5 shows a graphical representation of sensing circuit digital output over time according to one aspect of the present invention.
Figure 6:
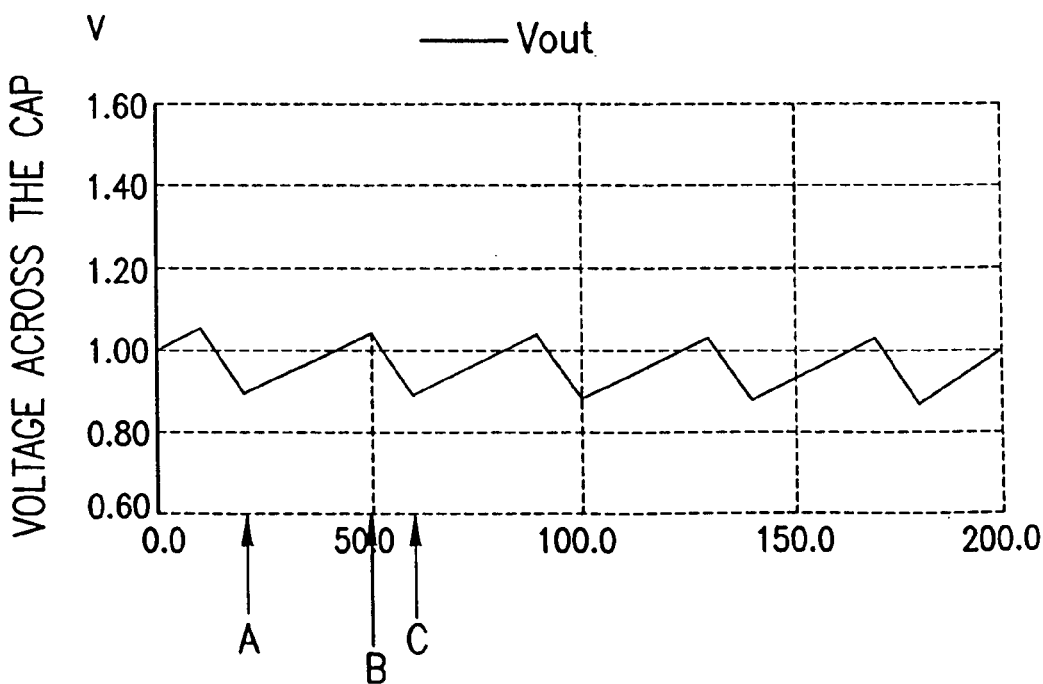
FIG. 6 shows a graphical representation of voltage across a capacitor over time according to one aspect of the present invention.

FIGS. 5 and 6 show an exemplary relationship between the output signal produced at output 900 of the clocked comparator 910 and the voltage on capacitor 510 over time. FIG. 5 shows the output signal produced by the clocked comparator when a 100 MHz clock signal is applied to the clock input 940. At a clock frequency of 100 MHz, clock pulses are spaced at an interval of 10 ns. In the example shown, the output of the clocked comparator is high 1160 for one clock pulse (10 ns) and low 1170 for three clock pulses (30 ns). This corresponds to the voltage waveform shown in FIG. 6. In FIG. 6, the voltage of the capacitor 510 is shown to begin rising when the output 900 of the clocked comparator goes low (time A), thereby turning on the PMOS transistor 770. The voltage rises for 30 ns, or three clock pulses until time B. At time B, the output of the clocked comparator goes high again, turning off the PMOS transistor. The voltage on the capacitor 510 then begins to drop again while the PMOS device remains off for one clock pulse, or 10 ns (until time C). Accordingly, in the example shown, the duty cycle of the signal output by the clocked comparator 910 is 75% (three on-pulses for every off-pulse).

Figure 7:
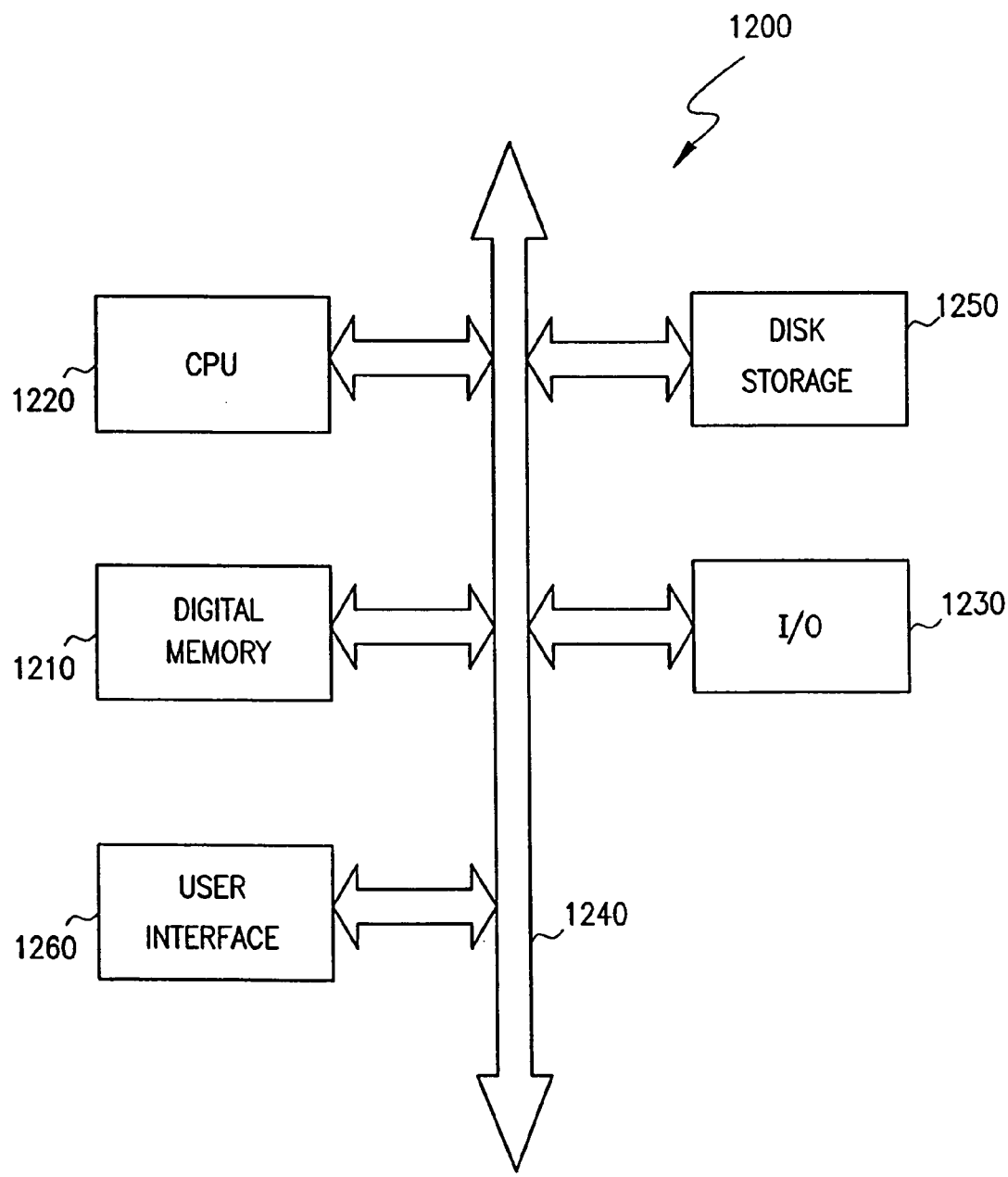
FIG. 7 shows a computer system incorporating a digital memory according to one aspect of the present invention.

FIG. 7 shows a computer system 1200 including a digital memory 1210 having a resistance measuring memory cell sensor according to the invention. The computer 1200, as shown includes a central processing unit (CPU) 1220, for example, a microprocessor, that communicates with one or more input/output (I/O) devices 1230 over a bus 1240. The computer system also includes peripheral devices such as disk storage 1250 and a user interface 1260. It may be desirable to integrate the processor and memory on a single IC chip.

While preferred embodiments of the invention have been described and illustrated above, it should be understood that these are exemplary of the invention and are not to be considered as limiting. Additions, deletions, substitutions, and other modifications can be made without departing from the spirit or scope of the present invention. Accordingly, the invention is not to be considered as limited by the foregoing description but is only limited by the scope of the appended claims.

The invention claimed is:

1. A method of determining a value of a resistance in a circuit comprising:
    discharging a capacitance through the resistance while repeatedly recharging the capacitance, said recharging being performed with a pulsing recharging signal;
    determining a duty cycle of the recharging signal; and
    obtaining the value of the resistance from the duty cycle of the recharging signal.

2. A method of determining a value of a resistance as in claim 1, wherein the recharging signal for the capacitance is a substantially constant current.

3. A method of determining a value of a resistance as in claim 1, wherein:
    the recharging signal is pulsed, and
    the duty cycle is determined by counting recharging signal pulses during a sensing period.

4. A method of determining a value of a resistance as in claim 3, wherein the capacitor is charged prior to a start of the sensing period.

5. A method of determining a value of a resistance as in claim 3, wherein the circuit includes a resistance-based memory.

6. A method of determining a value of a resistance as in claim 5, wherein the resistance-based memory is an MRAM.

7. A method for sensing a value of a resistance comprising:
    charging a capacitance to a voltage level above a threshold value;
    selecting one of a plurality of resistances;
    discharging the capacitance through the selected resistance;
    generating at least one recharging pulse each time the voltage level on the capacitor falls below the threshold value;
    using the recharging pulse to recharge the voltage level on the capacitor above the threshold value; and
    determining a reference value of the selected resistance from the number of recharging pulses which are generated during a finite period of time during which the capacitance is discharging through the selected resistance.

8. A method as defined in claim 7 wherein the discharging includes discharging the capacitance through the resistance at a constant current.

9. A device state sensing circuit comprising:
    a voltage supply;
    an electronic charge storage device electrically connected with the voltage supply;
    a current source electrically connected with the electronic charge reservoir; and
    a pulse counter in communication with the current source to generate a pulse counter count,
    wherein:
        the voltage supply is operatively connected to a selected memory cell of a memory device comprising a plurality of memory cells to maintain a substantially constant voltage across a resistive element of the selected memory cell;
        the electronic charge storage device is operatively connected to the voltage supply to provide a current through the resistive element;
    the current source is operatively connected to the charge reservoir to repeatedly supply a pulse of current to recharge the charge reservoir upon a predetermined depletion of electronic charge from the reservoir through the resistive element; and
    the pulse counter count is a number of the pulses supplied by the current source over a finite time period during which the current is supplied through the resistive element, the pulse counter count representing a logic state of the selected memory cell.

* * * * *

UNITED STATES PATENT AND TRADEMARK OFFICE
CERTIFICATE OF CORRECTION

PATENT NO.       : 7,133,307 B2
APPLICATION NO.  : 10/674550
DATED            : November 7, 2006
INVENTOR(S)      : R. Jacob Baker It is certified that error appears in the above-identified patent and that said Letters Patent is hereby corrected as shown below:

In the Specification, the following errors are corrected:

Column 3, line 63, "dock" should read --clock--;

Column 5, line 13, "dock" should read --clock--;

Column 5, line 57, "dock" should read --clock--;

Column 5, line 62, "dock cycle of dock" should read --clock cycle of clock--;

Column 6, line 41, "dock" should read --clock--;

Column 6, line 42, "dock" should read --clock--; and

Column 6, line 56, "docked" should read --clocked--.

In Claim 9, the following errors are corrected:

Column 8, line 19, "reservoir" should read --storage device--;

Column 8, line 33, "reservoir" should read --storage device--;

Column 8, line 34, "reservoir" should read --storage device--; and

Column 8, line 35, "reservoir" should read --charge storage device--.

Signed and Sealed this

Sixteenth Day of January, 2007

JON W. DUDAS
*Director of the United States Patent and Trademark Office*